United States Patent [19]

Weitzel et al.

[11] Patent Number: 5,693,969
[45] Date of Patent: Dec. 2, 1997

[54] MESFET HAVING A TERMINATION LAYER IN THE CHANNEL LAYER

[75] Inventors: Charles E. Weitzel, Mesa; Karen E. Moore, Phoenix; Christine Thero, Scottsdale, all of Ariz.

[73] Assignee: Motorola, Schaumburg, Ill.

[21] Appl. No.: 398,838

[22] Filed: Mar. 6, 1995

[51] Int. Cl.$^6$ .................. H01L 29/80; H01L 31/0312
[52] U.S. Cl. ............................... 257/280; 257/77
[58] Field of Search ........................ 257/77, 272, 280, 257/282, 284; 437/100

[56] References Cited

U.S. PATENT DOCUMENTS

| 4,263,340 | 4/1981 | Nuzillat et al. | 257/280 |
| 5,399,883 | 3/1995 | Baliga | 257/77 |

FOREIGN PATENT DOCUMENTS

| 3-171737 | 7/1991 | Japan | 257/280 |

OTHER PUBLICATIONS

Shimamoto et al., "Improvement of breakdown voltage characteristics of GaAs junction by damage-creation of ion-implantation", Inst. Phys. Conf. Ser. No. 120, Chapter 4, Paper presented at Int. Symp. GaAs and Related Compounds, Seattle, 1991, 1992 IOP Publishing Ltd., pp. 199-202.

*Primary Examiner*—Steven H. Loke
*Attorney, Agent, or Firm*—Eugene A. Parsons

[57] ABSTRACT

A lateral MESFET (10,20) utilizes a drain (17) and a source (18) damage termination layer to improve the breakdown voltage of the MESFET (10,20). The source (18) and drain (17) damage termination layers are very shallow to prevent interfering with lateral current flow in the channel layer (12). The source (18) and drain (17) damage termination layers are formed by implanting large inert ions using high implant doses and low implantation energies.

4 Claims, 2 Drawing Sheets

MESFET HAVING A TERMINATION LAYER IN THE CHANNEL LAYER

BACKGROUND OF THE INVENTION

The present invention relates, in general, to semiconductor devices, and more particularly, to a novel high breakdown voltage transistor.

In the past, the semiconductor industry has utilized a variety of techniques to increase the gate-to-drain breakdown voltage of gallium arsenide (GaAs) metal semiconductor field effect transistors (MESFET). One prior technique generally involves implanting a dopant species adjacent to the gate of the MESFET, and annealing the doped area at high temperatures to create a high resistance area. However, this prior method typically has a negative effect on other transistor parameters such as lowering the transconductance and lowering the frequency response of the MESFET. Moreover, the high temperature implant anneal limits the gate material to high resistance refractory metals which can tolerate the high' temperature anneal. Additionally, this technique typically provides a breakdown voltage that is only 60–75% of that of the channel material.

Another technique that is applied to vertical current flow diodes involves implanting hydrogen or boron ions adjacent to the anode of the diode. The ion implantation area typically extends from the surface very deep, for example 200 to 1000 nanometers, into underlying layers. However, this prior method causes higher leakage current. This technique is suitable for vertical current flow diodes because the current does not flow through the implantation area.

Accordingly, it is desirable to have a method of increasing the breakdown voltage of a MESFET that results in a breakdown voltage that is near at least 80% of the breakdown voltage of the channel material, that does not affect the transconductance of the MESFET, that does not affect the frequency response of the MESFET, and that does not require the use of a high resistance refractory gate material.

DETAILED DESCRIPTION OF THE DRAWINGS

Figure 1:
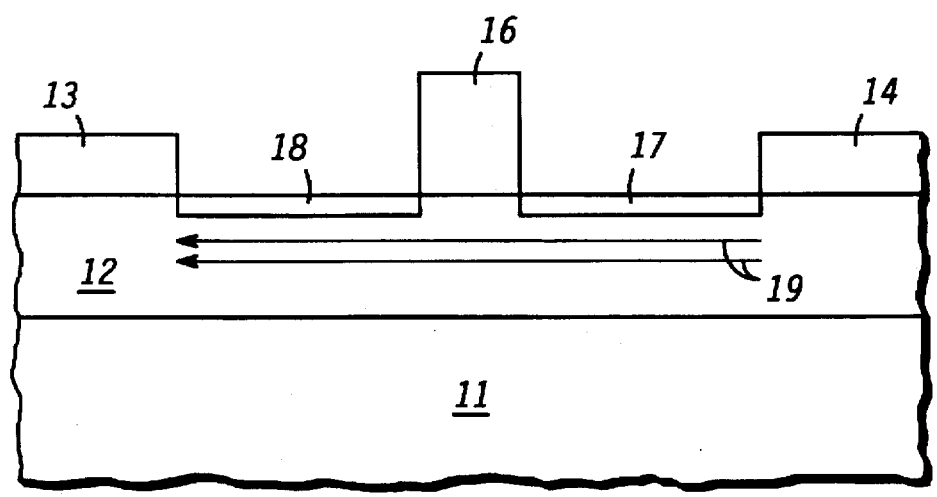
FIG. 1 illustrates an enlarged cross-sectional portion of a transistor in accordance with the present invention.

FIG. 1 illustrates an enlarged cross-sectional portion of a metal semiconductor field effect transistor (MESFET) 10 that has a high breakdown voltage. Transistor 10 is formed on a semiconductor substrate 11, for example, a GaAs or SiC substrate. A low resistance channel layer 12 is epitaxially formed on substrate 11 to provide a low resistance path for current flow between a source contact 13 and a drain contact 14 that are formed on a surface of layer 12. Drain contact 14 is laterally displaced from source contact 13 and a Schottky gate 16 is positioned therebetween on channel layer 12. Transistor 10 also has a drain damage termination layer 17 and a source damage termination layer 18 that are used to increase the gate-to-drain and gate-to-source breakdown voltages, respectively, of transistor 10. Layers 17 and 18 are areas where atoms are displaced from the lattice structure of layer 12. The displaced atoms become interstitial atoms that are randomly distributed within layer 17 and increase the resistance within layer 17. For example, typical semiconductor material such as GaAs or SiC has about $1 \times 10^{13}$ missing or interstitial atoms/cm$^3$. Layers 17 and 18 typically have greater than approximately $1 \times 10^{20}$ interstitial atoms/cm$^3$. As will be seen hereinafter, layers 17 and 18 generally are created by implanting large inert ions into layer 12. The inert ions minimize electrical alteration on the material used for layer 12.

Drain damage termination layer 17 extends laterally toward contact 14 from an intersection of gate 16 and layer 12 that is near contact 14. The closer layer 17 extends toward an intersection of contact 14 and layer 12, the higher the gate-to-drain breakdown voltage of transistor 10. Source damage termination layer 18 extends toward source contact 1 3 from an intersection of gate 16 and layer 12 that is near contact 13, in order to increase the gate-to-source breakdown voltage of transistor 10. The closer layer 18 extends toward contact 13, the higher the gate-to-source breakdown voltage. However, layer 18 can increase the gate-to-source resistance of transistor 10 thereby resulting in a decrease of the transconductance and frequency response. For example, for a channel layer 12 having a thickness of three hundred fifty nanometers and a layer 18 having a depth of fifty nanometers, the gate-to-source resistance can increase by fifteen percent and the frequency response may decrease by approximately ten to fifteen percent, but the gate-to-source breakdown voltage may increase by approximately 100 percent.

Because the output power of transistor 10 is directly proportional to the square of the gate-to-drain breakdown voltage, it is important to have a high gate-to-drain breakdown voltage. However, decreasing the gate-to-source resistance and the frequency response can be more detrimental than increasing the gate-to-source breakdown voltage. Consequently, the preferred embodiment of transistor 10 typically does not incorporate layer 18 in order to minimize the gate-to-source resistance.

Within transistor 10 current 19, indicated by an arrow, flows from contact 14 through channel layer 12, and toward contact 13. Because current 19 flows close to the surface of channel layer 12, it is important that layers 17 and 18 are shallow and close to the surface of layer 12 to prevent impeding current 19. Typically, layers 17 and 18 extend from the surface of layer 12 only about twenty to one hundred nanometers into layer 12 in order to prevent adversely affecting the transconductance and frequency response of transistor 10. In the preferred embodiment, layer 18 is omitted to prevent adversely effecting the gate-to-source resistance, and layer 17 extends from the surface of layer 12 less than approximately fifty nanometers into layer 12 in order to prevent adversely affecting the transconductance and frequency response of transistor 10. In this preferred embodiment, transistor 10 has a frequency response that is approximately equal to the frequency response of a transistor not having layer 17, a transconductance that is approximately equal to a transistor not having layer 17, and a breakdown voltage that is approximately eighty-five to ninety-five percent of the breakdown voltage of the bulk material used for channel layer 12.

Figure 2:
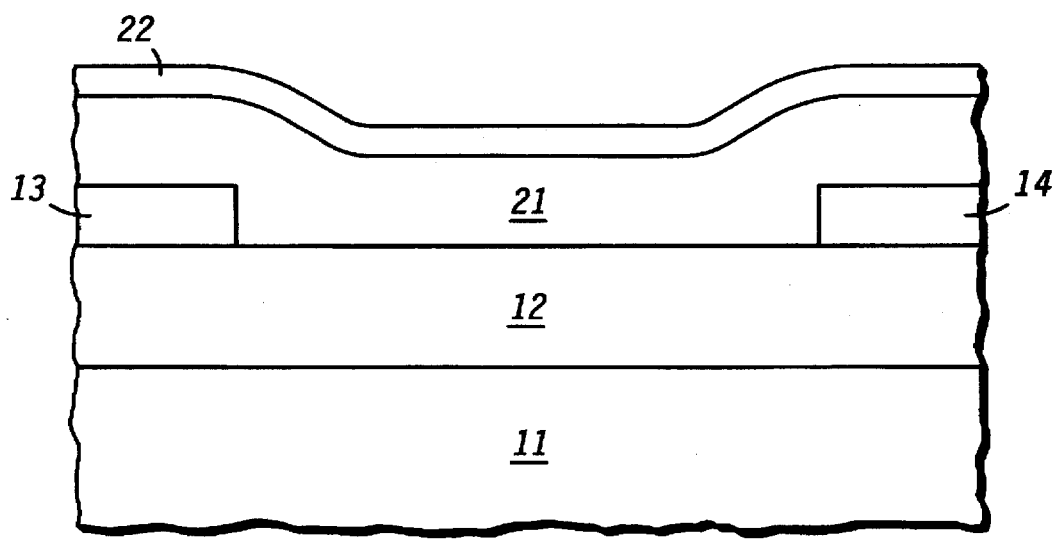
FIG. 2 and FIG. 3 illustrate enlarged cross-sectional portions to explain manufacturing stages of another embodiment in accordance with the invention.

FIG. 2 illustrates an enlarged cross-sectional portion of a transistor 20 that is an alternate embodiment of transistor 10 (FIG. 1) at a stage in the formation of transistor 20. Elements of FIG. 2 that have the same reference numbers as FIG. 1 are the same as the corresponding FIG. 1 elements. Contacts 13 and 14 are formed on layer 12 by techniques that are well known to those skilled in the semiconductor art. A dielectric layer 21, for example silicon dioxide or other usable dielectric materials such as silicon nitride, is formed covering contacts 13 and 14, and the exposed portion of layer 12 between contacts 13 and 14. Subsequently, a non-ohmic or contact metal 22, for example aluminum or gold, is applied to dielectric 21. The material used for metal 22 should form an ohmic contact with the material used for gate 16 as will be seen hereinafter in FIG. 3.

Figure 3:
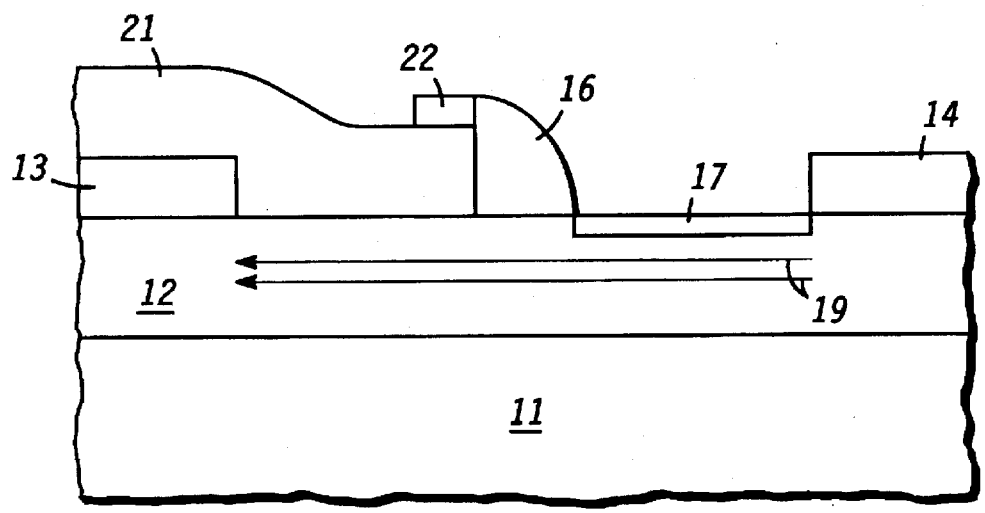

FIG. 3 illustrates an enlarged cross-sectional portion of a subsequent stage in the formation of transistor 20. Elements of FIG. 3 that have the same reference numbers as FIG. 1 or FIG. 2 are the same as the corresponding FIG. 1 or FIG. 2 elements. A mask is applied to metal 22 and patterned to expose a portion of metal 22 overlying a first portion of the surface of layer 12, that is, a portion of layer 12 where gate 16 and layer 17 are subsequently formed. A reactive ion etch is utilized to remove the portion of metal 22 and underlying portions of dielectric 21 thereby exposing the first portion of the surface of channel layer 12. The mask is removed. After this operation, the remaining portion or first portion of dielectric 21 is still covered with metal 22. A second mask is applied and patterned to expose a gate portion of channel layer 12, that is, a portion of channel layer 12 where gate 16 is to be applied. Subsequently, gate 16 is formed by depositing a metal, for example gold, titanium, platinum, or lanthanum hexaboride, that creates a Schottky contact with the material used for channel layer 12, then the second mask is removed. Metal 22 now forms an ohmic contact with gate 16 and can be utilized to create a low resistance contact for gate 16. Typically, a portion of metal 22 distal from gate 16 is removed leaving the portion of metal 22 that is adjacent to and in contact with gate 16.

Thereafter, drain damage termination layer 17 is formed utilizing gate 16 and contact 14 as a mask to ensure that layer 17 is self aligned to gate 16 and contact 14. As indicated hereinbefore, it is important that layer 17 be very shallow and close to the surface of layer 12 in order to prevent electrically interfering with current 19. To keep layer 17 shallow, the implantation species utilized typically has large atoms in order to maximize the amount of damage created and to minimize penetration into layer 12. Also, high implant dosages and low implant energies are utilized to further increase damage and minimize penetration, respectively, into layer 12. Subsequently, layer 17 is annealed at a low temperature to reduce surface leakage while substantially preventing displaced or interstitial atoms from migrating back into the lattice structure. The low temperature annealing also permits using low resistance non-refractory metals such as gold, or aluminum for gate 16. Layer 17 typically is annealed at temperatures less than approximately 500° C. for times of less than approximately ten minutes.

For example, for a gallium arsenide (GaAs) channel layer 12, an inert species having large atoms such as argon or krypton can be implanted at a dosage of approximately $1 \times 10^{13}$ to $5 \times 10^{15}$ atoms/cm$^2$ at an energy of forty keV or less in order to maintain the depth of layer 17 less than approximately one hundred nanometers. Subsequently layer 17 is annealed as discussed hereinbefore. In the past, implants such as layers 17 and 18 typically were not formed because the implant profile easily spreads to occupy a large portion of the channel layer thereby negatively impacting transconductance and frequency response.

For a silicon carbide layer 12, large atoms such as argon or krypton can be implanted at dosages from $1 \times 10^{13}$ to $5 \times 10^{15}$ atoms/cm$^2$ at energies of less than forty keV to prevent forming layer 17, after annealing, greater than one hundred nanometers into layer 12. Subsequent low temperature annealing at temperatures less than approximately 500° C. for times of less than approximately ten minutes, also prevents activating the inert species in the SiC layer 12

In order to form both layer 17 and layer 18, the steps of applying dielectric 21 and metal 22 can be omitted, thus, contacts 13 and 14 and gate 16 can be utilized as a mask for the ion implantation of both layers 17 and 18.

Figure 4:
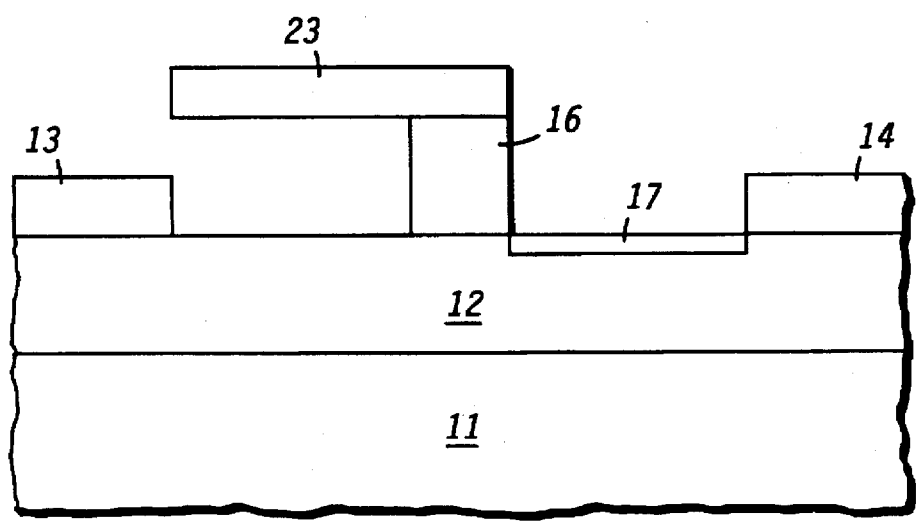
FIG. 4 illustrates a cross-sectional portion of an alternate implementation method for the transistor of FIG. 1 in accordance with the present invention.

FIG. 4 illustrates an alternate method of forming layer 17 of transistor 20. A shadow mask or metal 23 is formed on gate 16 utilizing lift-off techniques that are well known to those skilled in the semiconductor art. Mask 23 protects the portion of layer 12 between gate 16 and source contact 13 in order to prevent forming layer 18. Layer 17 is formed as explained in the discussion of FIG. 3.

By now it should be appreciated that there has been provided a novel method of forming a transistor having a high gate-to-drain breakdown voltage and a high gate-to-source breakdown voltage. Forming a very shallow damage termination layer ensures that the damage termination layer does not impede current flow in the channel layer. Implanting an inert species prevents affecting the channel doping between the gate-to-drain and gate-to-source areas of the channel layer. Utilizing high implantation dosages and low energies further restricts the depth of the damage termination layer into the channel layer.

We claim:

1. A lateral MESFET comprising:

a substrate;

a channel layer on the substrate;

a source contact on the channel layer;

a drain contact on the channel layer and laterally displaced from the source contact;

a Schottky gate on the channel layer between the source contact and the drain contact;

a first dielectric on the source contact and on the channel layer between the source contact and the gate contact, a contact metal on the first dielectric and electrically contacting the Schottky gate; and a drain damage termination layer in the channel layer extending laterally from the Schottky gate toward the drain contact wherein the drain damage termination layer is formed by implanting dopant atoms into the channel layer and annealing the MESFET.

2. The lateral MESFET of claim 1, wherein the drain damage termination layer extends approximately twenty to one hundred nanometers into the channel layer and has at least approximately $1 \times 10^{20}$ interstitial atoms/cm$^3$.

3. The lateral MESFET of claim 1 wherein the substrate is one of GaAs or SiC.

4. The lateral MESFET of claim 1 wherein the drain damage termination layer extends from approximately an intersection of the Schottky gate with the channel layer toward the drain contact.

* * * * *